United States Patent
Xie et al.

(10) Patent No.: US 10,777,465 B2
(45) Date of Patent: Sep. 15, 2020

(54) INTEGRATION OF VERTICAL-TRANSPORT TRANSISTORS AND PLANAR TRANSISTORS

(71) Applicant: GLOBALFOUNDRIES Inc., Grand Cayman (KY)

(72) Inventors: Ruilong Xie, Niskayuna, NY (US); Chun-chen Yeh, Danbury, CT (US); Kangguo Cheng, Schenectady, NY (US); Tenko Yamashita, Schenectady, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 108 days.

(21) Appl. No.: 15/868,199

(22) Filed: Jan. 11, 2018

(65) Prior Publication Data
US 2019/0214307 A1    Jul. 11, 2019

(51) Int. Cl.
*H01L 21/8234* (2006.01)
*H01L 29/78* (2006.01)
(Continued)

(52) U.S. Cl.
CPC ........ *H01L 21/823456* (2013.01); *H01L 21/823412* (2013.01); *H01L 21/823487* (2013.01);
(Continued)

(58) Field of Classification Search
CPC ........... H01L 21/845; H01L 21/76895; H01L 21/30604; H01L 21/265; H01L 29/6656; H01L 29/66795; H01L 29/785; H01L 27/1211; H01L 21/324; H01L 21/823456; H01L 21/823487; H01L 27/088;
(Continued)

(56) References Cited

U.S. PATENT DOCUMENTS

| 7,189,617 B2 | 3/2007 | Slesazeck et al. |
| 7,498,632 B2 | 3/2009 | Lee |

(Continued)

FOREIGN PATENT DOCUMENTS

| TW | 200525749 B | 3/2006 |
| WO | 2005065385 A2 | 7/2005 |

OTHER PUBLICATIONS

USPTO, final Office Action issued in U.S. Appl. No. 15/604,932 dated Oct. 4, 2018.
(Continued)

*Primary Examiner* — Mouloucoulaye Inoussa
(74) *Attorney, Agent, or Firm* — Thompson Hine LLP; Anthony Canale

(57) ABSTRACT

Structures including a vertical-transport field-effect transistor and a planar field-effect transistor, and methods of forming such structures. First and second sacrificial fins are respectively formed over first and second areas of the first device region. One or more semiconductor fins of the vertical-transport field-effect transistor are formed over the second device region. A first gate electrode of the planar field-effect transistor, which is arranged on the first device region between the first sacrificial fin and the second sacrificial fin, and a second gate electrode of the vertical-transport field-effect transistor, which is wrapped about the one or more semiconductor fins, are currently formed.

10 Claims, 4 Drawing Sheets

(51) Int. Cl.
   *H01L 27/088* (2006.01)
   *H01L 29/66* (2006.01)
   *H01L 29/51* (2006.01)

(52) U.S. Cl.
   CPC ...... *H01L 27/088* (2013.01); *H01L 29/66636* (2013.01); *H01L 29/66666* (2013.01); *H01L 29/7827* (2013.01); *H01L 29/513* (2013.01); *H01L 29/78* (2013.01)

(58) Field of Classification Search
   CPC ......... H01L 29/66636; H01L 29/66666; H01L 29/7827; H01L 29/513; H01L 29/78; H01L 21/823431; H01L 21/823437; H01L 29/66818; H01L 21/823807; H01L 21/823821; H01L 21/823828; H01L 21/82385; H01L 21/823878; H01L 27/092; H01L 27/0924; H01L 29/1054; H01L 29/66545; H01L 21/02233; H01L 21/308; H01L 21/76224; H01L 29/0649; H01L 21/76237; H01L 21/76897; H01L 21/823425; H01L 27/10855; H01L 27/10888; H01L 21/823481; H01L 21/76834; H01L 27/10873
   USPC ....... 438/283, 151, 253, 597, 268, 305, 232, 438/306, 396; 257/347, 306, 329, 390, 257/369, E21.646, E27.06, E27.084, 257/E21.633, E21.635, E21.638, E21.642, 257/E21.703, E27.062, E27.112
   See application file for complete search history.

(56) References Cited

U.S. PATENT DOCUMENTS

| | | | |
|---|---|---|---|
| 7,601,583 B2 | 10/2009 | Jang et al. | |
| 8,455,945 B2 | 6/2013 | Lee et al. | |
| 8,647,938 B1 | 2/2014 | Baars et al. | |
| 8,691,649 B2 | 4/2014 | Park et al. | |
| 8,835,262 B2 | 9/2014 | Cai et al. | |
| 9,589,846 B1 | 3/2017 | Tsai et al. | |
| 10,026,737 B1 | 7/2018 | Ching et al. | |
| 2002/0173066 A1 | 11/2002 | Masuoka | |
| 2005/0167750 A1 | 8/2005 | Yang et al. | |
| 2006/0081895 A1 | 4/2006 | Lee et al. | |
| 2006/0237788 A1 | 10/2006 | Ishimaru | |
| 2009/0273984 A1 | 11/2009 | Tanzawa | |
| 2010/0213525 A1* | 8/2010 | Masuoka | H01L 21/82382 257/306 |
| 2012/0052640 A1 | 3/2012 | Fischer et al. | |
| 2012/0261756 A1* | 10/2012 | Kanike | H01L 21/845 257/350 |
| 2012/0319201 A1 | 12/2012 | Sun et al. | |
| 2013/0049135 A1 | 2/2013 | Moriyama | |
| 2013/0178031 A1 | 7/2013 | Ramkumar et al. | |
| 2014/0252442 A1 | 9/2014 | Chuang et al. | |
| 2014/0299938 A1 | 10/2014 | Zhang et al. | |
| 2016/0268256 A1 | 9/2016 | Yang et al. | |
| 2017/0025533 A1 | 1/2017 | Phoa et al. | |
| 2017/0062484 A1 | 3/2017 | Hsu et al. | |
| 2017/0373159 A1* | 12/2017 | Cheng | H01L 21/845 |
| 2018/0254220 A1* | 9/2018 | Leobandung | H01L 21/845 |

OTHER PUBLICATIONS

Taiwan Intellectual Property Office, Examination Report issued in Taiwanese Patent Application No. 106143156 and translation thereof dated Jul. 30, 2018.
USPTO, Office Action issued in U.S. Appl. No. 15/604,932 dated Jun. 20, 2018.
Ruilong Xie et al., "Integration of Vertical-Transport Transistors and High-Voltage Transistors", U.S. Appl. No. 15/604,932, filed May 25, 2017.
Ruilong Xie et al., "Integration of Vertical Field-Effect Transistors and Saddle Fin-Type Field Effect Transistors", U.S. Appl. No. 15/427,403, filed Feb. 8, 2017.
USPTO, Notice of Allowance issued in U.S. Appl. No. 15/427,403 dated Sep. 12, 2018.

* cited by examiner

INTEGRATION OF VERTICAL-TRANSPORT TRANSISTORS AND PLANAR TRANSISTORS

BACKGROUND

The present invention relates to semiconductor device fabrication and integrated circuits and, more specifically, to methods for forming a structure that includes vertical-transport field-effect transistors and structures that include vertical-transport field-effect transistors.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate associated with their formation.

Planar field-effect transistors and fin-type field-effect transistors constitute a category of transistor structures in which the flow of gated current in the channel is oriented in a horizontal direction parallel to the substrate surface. In a vertical-transport field-effect transistor, the source/drain regions are arranged at the top and bottom of a semiconductor fin or pillar. The direction of the gated current in the channel between the source region and the drain region is oriented generally perpendicular (i.e., vertical) to the substrate surface and parallel to the height of the semiconductor fin or pillar.

SUMMARY

In an embodiment, a method is provided for forming a vertical-transport field-effect transistor using a first device region of a substrate and a planar field-effect transistor using a second device region of the substrate. The method includes forming a first sacrificial fin over a first area of the first device region and a second sacrificial fin over a second area of the first device region, and forming one or more semiconductor fins of the vertical-transport field-effect transistor over the second device region. The method further includes concurrently forming a first gate electrode of the planar field-effect transistor that is arranged on the first device region between the first sacrificial fin and the second sacrificial fin and a second gate electrode of the vertical-transport field-effect transistor that is wrapped about the one or more semiconductor fins.

In an embodiment, a structure is formed using a first device region and a second device region of a substrate. The structure includes a vertical-transport field-effect transistor and a planar field-effect transistor. The planar field-effect transistor includes a first gate electrode and a first gate dielectric arranged between the first gate electrode and the first device region. The vertical-transport field-effect transistor includes one or more semiconductor fins on the second device region, a second gate electrode, and a second gate dielectric arranged between the second gate electrode and the one or more semiconductor fins. The first gate electrode and the second gate electrode have equal thicknesses.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
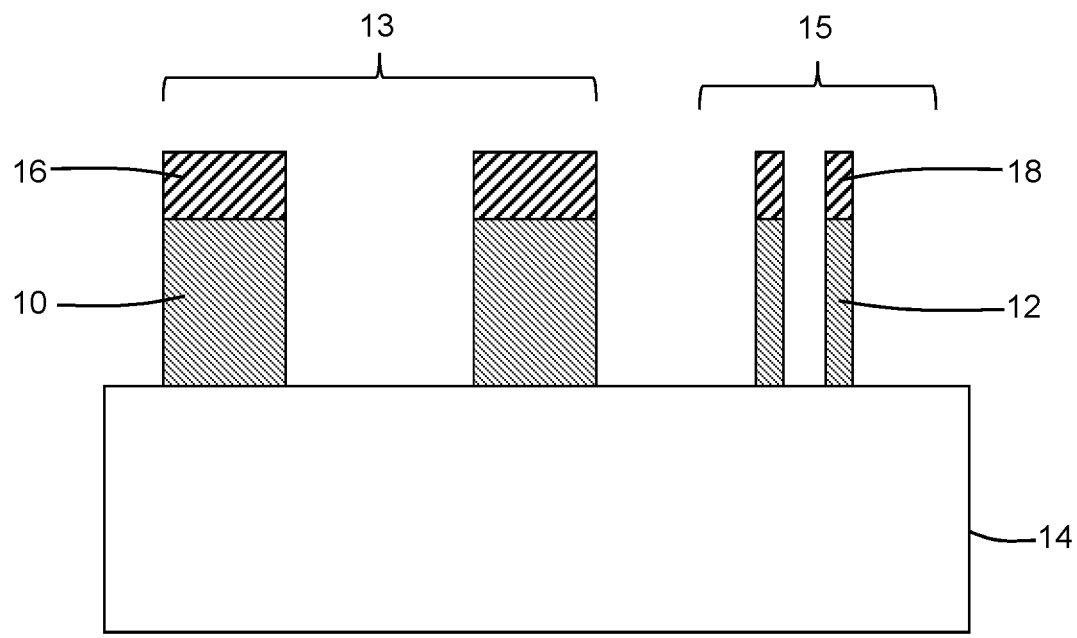
FIGS. 1-8 are cross-sectional views showing a structure at successive fabrication stages of a processing method in accordance with embodiments of the invention.

With reference to FIG. 1 and in accordance with an embodiment of the invention, sacrificial fins 10 project in a vertical direction from a substrate 14 in a device region 15 and semiconductor fins 12 project in a vertical direction from a substrate 14 in a device region 13. The substrate 14 may be, for example, a bulk single-crystal silicon wafer. Hardmasks 16 and 18 can be respectively patterned by lithography and etching process in device regions 13 and 15. There can be several options for the lithography process, such as direct EUV printing or a combination of direct EUV printing with immersion lithography, as well as self-aligned double patterning (SADP) or self-aligned quadruple patterning (SAQP). After the sections of the hardmasks 16, 18 are formed, a single anisotropic etching process, such as reactive ion etching (RIE), may be used to pattern the sacrificial fins 10 and semiconductor fins 12. The sacrificial fins 10 are wider than the semiconductor fins 12, the sacrificial fins 10 are each capped by a section of the hardmask 16, and the semiconductor fins 12 are each capped by a section of the hardmask 18.

The sacrificial fins 10 are placeholder structures used to form a high-voltage planar field-effect transistor, such as an input/output (I/O) transistor. The gate length of the completed planar field-effect transistor is related to the spacing, s, between the sacrificial fins 10. The semiconductor fins 12 are used to subsequently form a vertical-transport field-effect transistor. The gate length of the vertical-transport field-effect transistor is related to the height, h, of the semiconductor fins 12. Consequently, the respective gate lengths are decoupled from each other.

Figure 2:
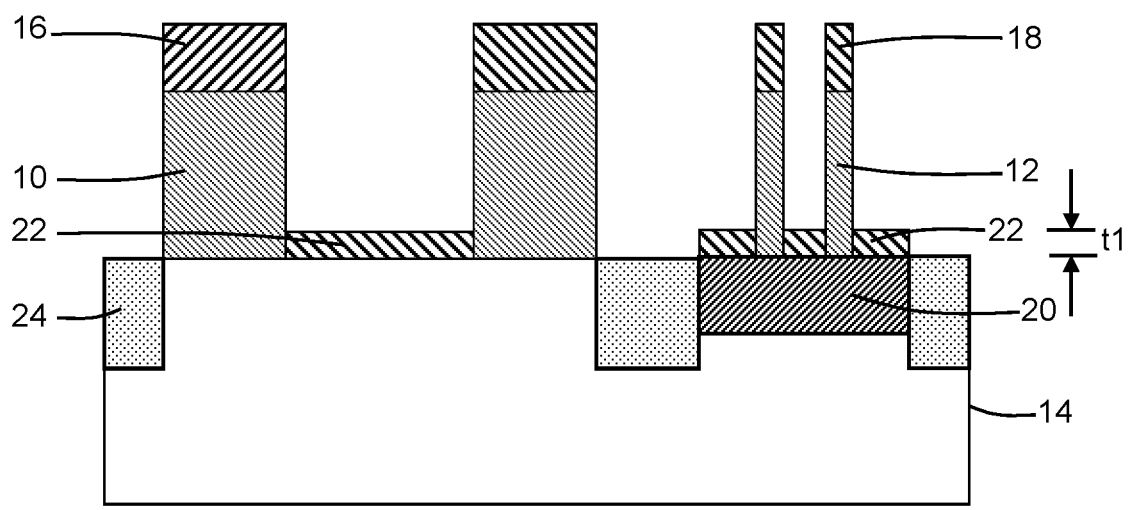

With reference to FIG. 2 in which like reference numerals refer to like features in FIG. 1 and at a subsequent fabrication stage, a bottom source/drain region 20 is formed in device region 15 proximate to the top surface of a substrate 14 and beneath the semiconductor fins 12, which are coupled with the bottom source/drain region 20. As used herein, the term "source/drain region" means a doped region of semiconductor material that can function as either a source or a drain of a vertical field-effect transistor. The bottom source/drain region 20 may be formed in device region 15 by epitaxy or ion implantation with a mask masking the device region 13 of the substrate 14. In connection with the formation of an n-type vertical-transport field effect transistor, the bottom source/drain region 20 may be doped with a concentration of an n-type dopant from Group V of the Periodic Table (e.g., phosphorus (P) and/or arsenic (As)) to provide n-type electrical conductivity. In connection with the formation of a p-type vertical-transport field effect transistor, the bottom source/drain region 20 may be doped with a concentration of a p-type dopant from Group III of the Periodic Table (e.g., boron (B), aluminum (Al), gallium (Ga), and/or indium (In)) to provide p-type electrical conductivity.

A dielectric layer 22 has a section arranged as a bottom spacer layer on the bottom source/drain region 20 in device region 15, and a section arranged as a gate dielectric on the substrate 14 between the sacrificial fins 10 in device region 13. The sections of the dielectric layer 22, which are concurrently formed, have equal thicknesses, t1, and the same composition. The dielectric layer 22 may be composed of a dielectric material, such as silicon dioxide ($SiO_2$), that is deposited by a directional deposition technique, such as high-density plasma (HDP) deposition or gas cluster ion beam (GCIB) deposition, or grown by thermal oxidation, and patterned with lithography and etching processes. The thickness of the dielectric layer 22 may be suitable to support high-voltage transistor operation as a gate dielectric.

Shallow trench isolation regions 24 are formed that penetrate to a shallow depth into the substrate 14. The shallow trench isolation regions 24 physically separate and electrically isolate the device region 13 from the device region 15. The shallow trench isolation regions 24 may be composed of a dielectric material, such as an oxide of silicon (e.g., silicon dioxide ($SiO_2$)), deposited by chemical vapor deposition (CVD) into trenches etched by a masked etching process into the substrate 14 and etched back to the top surface of the device regions 13 and 15.

Figure 3:
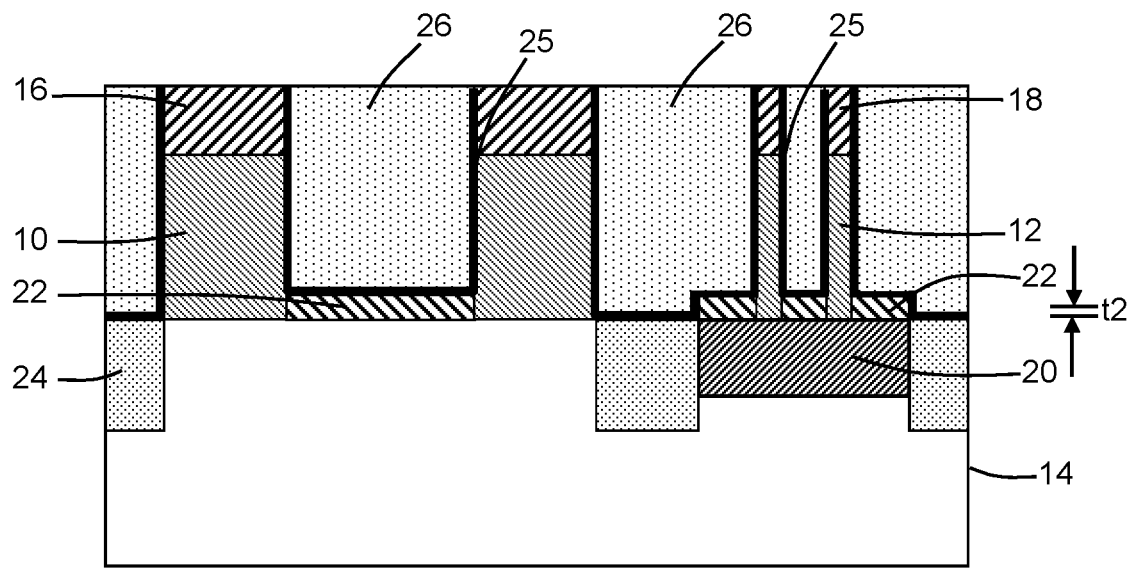

With reference to FIG. 3 in which like reference numerals refer to like features in FIG. 2 and at a subsequent fabrication stage, a gate dielectric layer 25 is conformally deposited over the sacrificial fins 10, the semiconductor fins 12, the dielectric layer 22, and the shallow trench isolation regions 24. The gate dielectric layer 25 may be composed of a dielectric material, such as a high-k dielectric having a dielectric constant (e.g., permittivity) higher than the dielectric constant of $SiO_2$. Candidate high-k dielectric materials for the gate dielectric layer 25 include, but are not limited to, a hafnium-based dielectric material like hafnium oxide ($HfO_2$), a layered stack of a hafnium-based dielectric material and another other dielectric material (e.g., aluminum oxide ($Al_2O_3$)), or combinations of these and other dielectric materials. The gate dielectric layer 25 is concurrently formed with the same thickness, t2, in both of the device regions 13 and 15.

A gate stack 26 is concurrently deposited over the gate dielectric layer 25 in both device regions 13 and 15. The gate stack 26 may include one or more barrier metal layers, work function metal layers, and/or fill metal layers that are composed of conductors, such as metals (e.g., tungsten (W)) and/or metal nitrides or carbides (e.g., titanium nitride (TiN) and titanium aluminum carbide (TiAlC)). The gate dielectric layer 25 and gate stack 26 are planarized by, for example, chemical mechanical polishing (CMP) stopping on the hardmasks 16 on the sacrificial fins 10 and the hardmasks 18 on the semiconductor fins 12.

Figure 4:
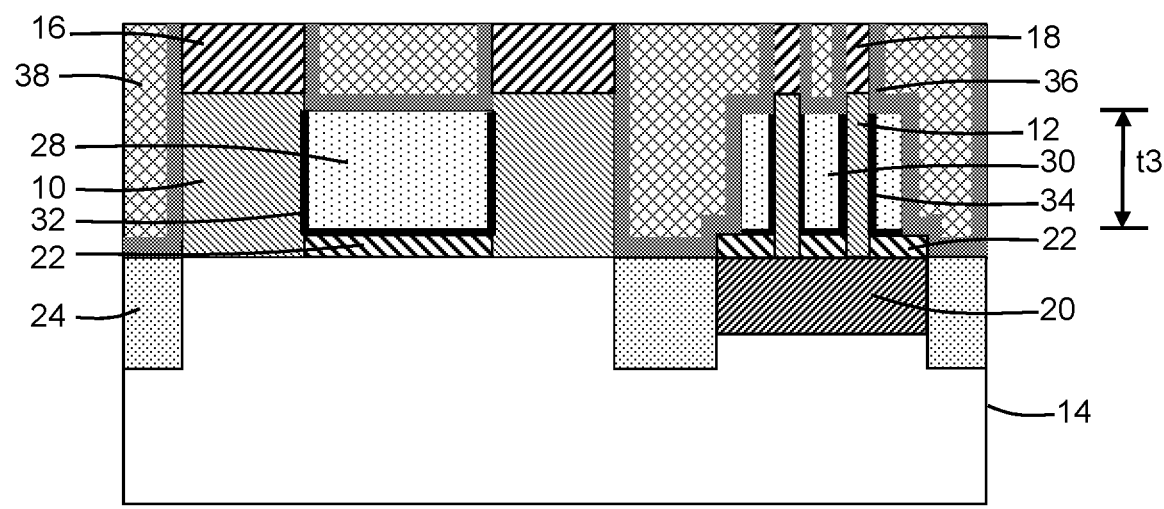

With reference to FIG. 4 in which like reference numerals refer to like features in FIG. 3 and at a subsequent fabrication stage, the gate stack 26 and the gate dielectric layer 25 are concurrently patterned with lithography and etching process, and then recessed with an etch-back process to form gate electrodes 28, 30 from the gate stack 26 and gate dielectrics 32, 34 from the gate dielectric layer 25. The planar field-effect transistor in device region 13 has a composite gate dielectric that includes a contribution from the dielectric material of the gate dielectric 32 and a contribution from the dielectric material of the section of the dielectric layer 22 arranged between the gate dielectric 32 and the top surface of the substrate 14. The composite gate dielectric has a dielectric constant that is equal to a composite of the dielectric constants of the material of the gate dielectric 32 and the material of the dielectric layer 22, and that is appropriate for a high-voltage planar field-effect transistor. The gate dielectric 32 and the gate dielectric 34, which are concurrently formed, have equal thicknesses and, in particular, individual thicknesses that are equal to the thickness of the gate dielectric layer 25. The gate electrode 28 and the gate electrode 30, which are concurrently formed by deposition and patterning, have equal thicknesses, t3.

A conformal dielectric layer 36 and an interlayer dielectric layer 38 are formed over the device regions 13 and 15, and are planarized with, for example, chemical mechanical polishing (CMP). The conformal dielectric layer 36 may be composed of a dielectric material, such as silicon nitride ($Si_3N_4$), deposited by atomic layer deposition (ALD). The interlayer dielectric layer 38 may be composed of a dielectric material, such as silicon dioxide ($SiO_2$), deposited by chemical vapor deposition (CVD). The conformal dielectric layer 36 in device region 15 provides a top spacer of the vertical-transport field effect transistor.

Figure 5:
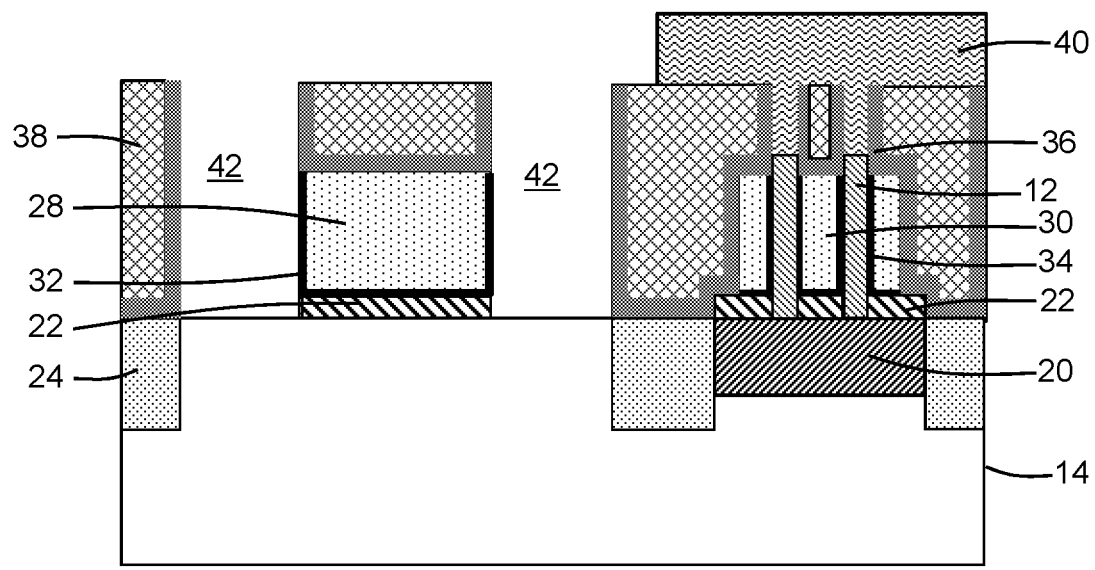

With reference to FIG. 5 in which like reference numerals refer to like features in FIG. 4 and at a subsequent fabrication stage, the hardmasks 16, 18 are removed with an etching process, and an etch mask 40 is applied that masks the device region 15 and exposes the device region 13. The sacrificial fins 10 are removed selective to the conformal dielectric layer 36 and the interlayer dielectric layer 38 using one or more etching processes, such as reactive ion etching (RIE) processes. Trenches 42 are formed at the locations of the removed sacrificial fins 10. The trenches 42 are arranged between the gate electrode 28 and the adjacent shallow trench isolation regions 24. The semiconductor fins 12 are masked and protected during the etching process by the etch mask 40.

Figure 6:
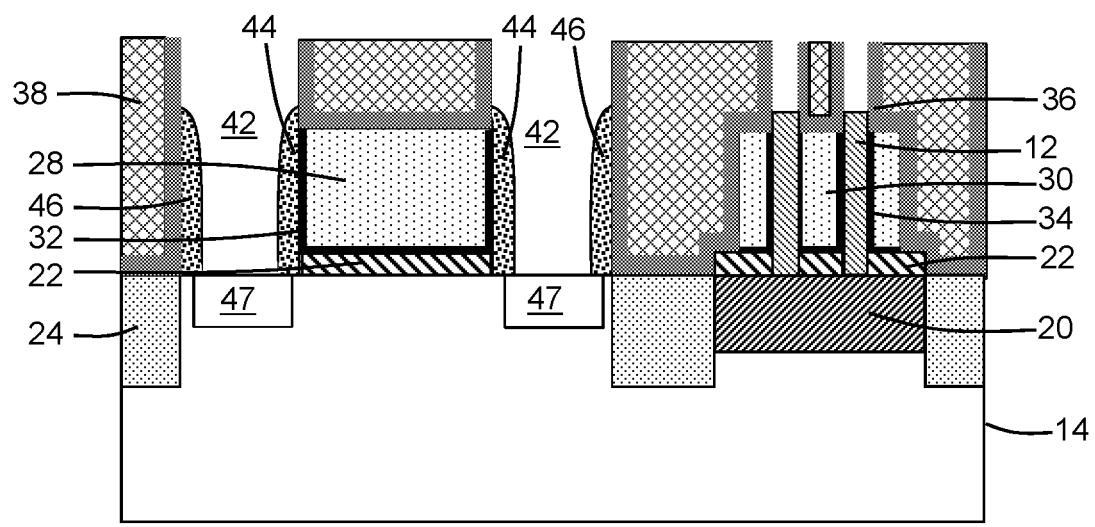

With reference to FIG. 6 in which like reference numerals refer to like features in FIG. 5 and at a subsequent fabrication stage, dielectric spacers 44 are formed inside the trenches 42 adjacent to the sidewalls of the gate electrode 28, and the etch mask 40 is removed from the device region 15. When dielectric spacers 44 are formed, dielectric spacers 46 are concurrently formed inside the trenches 42 adjacent to respective vertical sections of the conformal dielectric layer 36 and proximate to respective shallow trench isolation regions 24. The dielectric spacers 46 may be composed of a dielectric material, such as silicon nitride ($Si_3N_4$), deposited as a conformal layer by atomic layer deposition (ALD) and etched with a directional etching process such as reactive ion etching (RIE). Cavities 47 are formed in the substrate 14 adjacent to the gate electrode 28 by an etching process, such as a reactive ion etching (RIE) process, self-aligned to the dielectric spacers 46.

Figure 7:
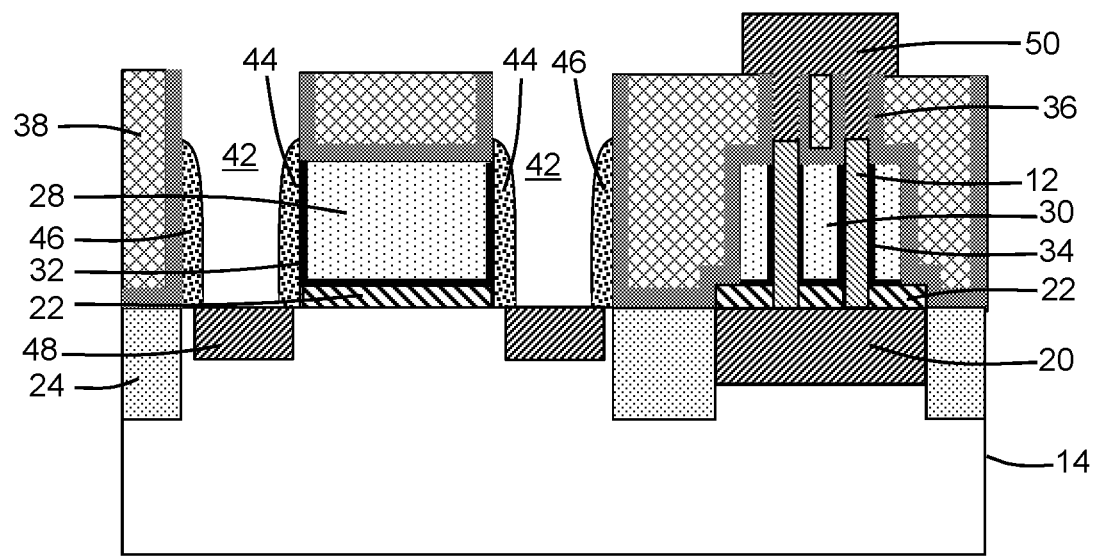

With reference to FIG. 7 in which like reference numerals refer to like features in FIG. 6 and at a subsequent fabrication stage, a top source/drain region 50 of the vertical-transport field-effect transistor is formed in device region 15 and source/drain regions 48 of the planar field-effect transistor are formed in the device region 13 after the sacrificial fins 10 are removed. In an embodiment, the source/drain regions 48 may be formed at least in part within the respective cavities 47 (FIG. 6) in the substrate 14 that are arranged adjacent to the gate electrode 28. In an embodiment, the source/drain regions 48 may be completely embedded in the cavities in the substrate 14 and lack a raised portion. As used herein, the term "source/drain region" means a doped region of semiconductor material that can function as either a source or a drain of a field-effect transistor. Extensions may be formed by ion implantation or dopant diffusion.

The semiconductor material epitaxially grows from the top surfaces of the semiconductor fins 12 in device region 15 and from the areas on the top surface of the substrate 14 in device region 13 that are exposed by the removal of the sacrificial fins 10. The conductivity type of the top source/drain region 50 matches the conductivity type of the bottom source/drain region 20, which is also the same as the conductivity type of the source/drain regions 48. For an n-type planar field-effect transistor, the source/drain regions 48 and top source/drain region 50 may be composed of epitaxially-grown semiconductor material doped with an n-type dopant from Group V of the Periodic Table (e.g., phosphorus (P) or arsenic (As)) to provide n-type conductivity. For a p-type planar field-effect transistor, the source/drain regions 48 and source/drain region 50 may be composed of epitaxially-grown semiconductor material doped with a p-type dopant selected from Group III of the Periodic Table (e.g., boron (B)) to provide p-type conductivity. In an embodiment, the source/drain regions 48 and source/drain region 50 may be formed by a selective epitaxial growth (SEG) process in which semiconductor material nucleates for epitaxial growth on semiconductor surfaces (e.g., semiconductor fins 12 and substrate 14), but does not nucleate for epitaxial growth from insulator surfaces (e.g., dielectric spacers 46 and interlayer dielectric layer 38).

Figure 8:
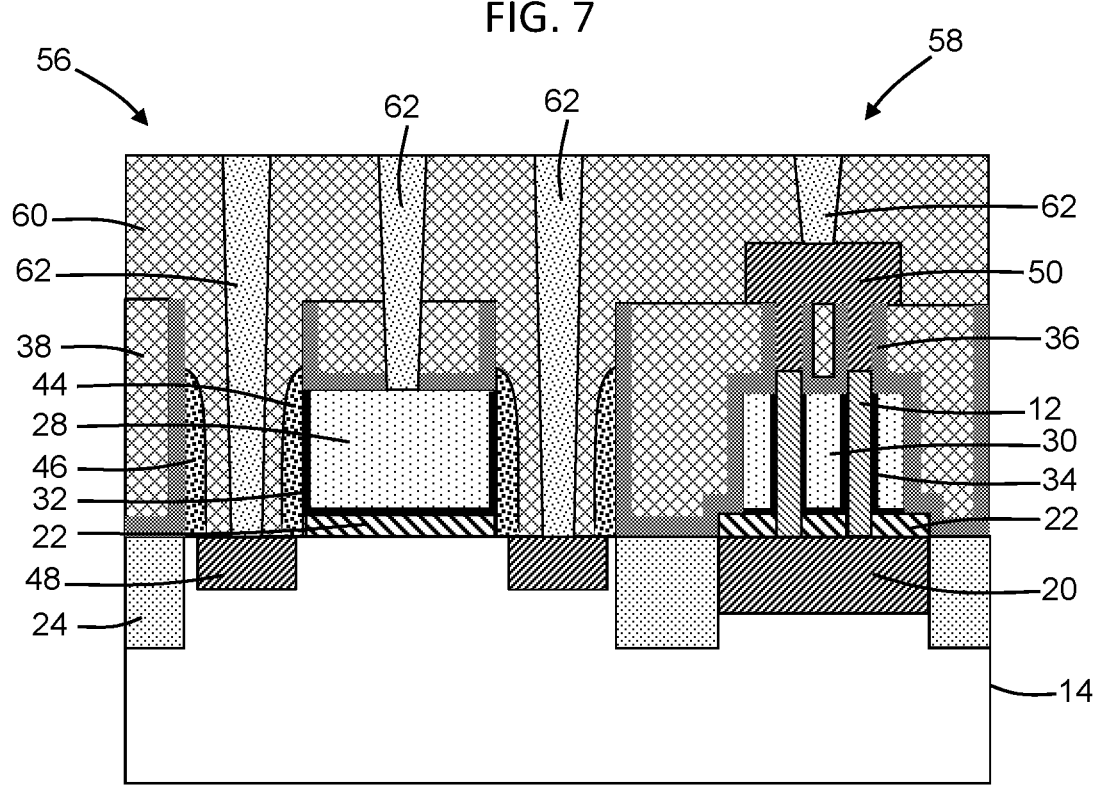

With reference to FIG. 8 in which like reference numerals refer to like features in FIG. 7 and at a subsequent fabrication stage, the resulting device structure includes a planar field-effect transistor 56 located in device region 13 and a vertical-transport field-effect transistor 58 located in device region 15. The planar field-effect transistor 56 is includes the gate electrode 28, a composite gate dielectric that includes sections of the dielectric layer 22 and the gate dielectric 32, and the source/drain regions 48. During operation, a horizontal channel for carrier transport is defined in the device region 13 beneath the gate electrode 28.

The vertical-transport field-effect transistor 58 includes the semiconductor fins 12, the bottom source/drain region 20, the top source/drain region 50, the gate electrode 30, and the gate dielectric 34. The gate electrode 30 is arranged along the height of the semiconductor fins 12 in the vertical direction between the bottom source/drain region 20 and the top source/drain region 50. During operation, a vertical channel for carrier transport is defined in a portion of the semiconductor fins 12 overlapped by the gate electrode 30 between the bottom source/drain region 20 and the top source/drain region 50.

Middle-of-line (MOL) and back-end-of-line (BEOL) processing follow, which includes formation of an interlayer dielectric layer 60 and contacts 62 for the local interconnect structure overlying the planar field-effect transistor 56 and the vertical-transport field-effect transistor 58, and formation of dielectric layers, via plugs, and wiring for an interconnect structure coupled by the contacts 62 of the local interconnect structure with the gate electrodes and source/drain regions of the planar field-effect transistor 56 and the vertical-transport field-effect transistor 58.

The integrated process flow forming planar field-effect transistors and vertical-transport field-effect transistors with the same process flow provides the flexibility to use vertical-transport field-effect transistors for applications such as high performance logic and static random access memory and to use planar field-effect transistors for high-voltage input/output applications. The gate length of the vertical-transport field-effect transistors is short and the gate dielectric is thin in comparison with the planar field-effect transistors, which are characterized by a long gate length and a thick gate dielectric.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a planar field-effect transistor using a first device region of a substrate and a vertical-transport field-effect transistor using a second device region of the substrate, the method comprising:

concurrently forming a first sacrificial fin over a first area of the first device region, a second sacrificial fin over a second area of the first device region, and one or more semiconductor fins of the vertical-transport field-effect transistor over the second device region;

forming a first gate dielectric on the first device region between the first sacrificial fin and the second sacrificial fin;

concurrently forming a first layer of a second gate dielectric on the first layer of the first gate dielectric and a second layer of the second gate dielectric on the one or more semiconductor fins;

after forming the first gate dielectric, the first layer of the second gate dielectric, and the second layer of the second gate dielectric, concurrently forming a first gate electrode of the planar field-effect transistor that is arranged on the first device region between the first sacrificial fin and the second sacrificial fin and a second gate electrode of the vertical-transport field-effect transistor that is wrapped about the one or more semiconductor fins; and removing the first sacrificial fin and the second sacrificial fin from the first device region without removing the first gate electrode of the planar field-effect transistor or the second gate electrode of the vertical-transport field-effect transistor, wherein the first gate dielectric is vertically arranged between the first gate electrode and the substrate in the first device region, and the second gate dielectric is comprised of a high-k dielectric layer.

2. The method of claim 1 further comprising:

epitaxially growing a source region and a drain region respectively using the first area and the second area of the first device region.

3. The method of claim 2 wherein the second device region includes a first source/drain region of the vertical-transport field-effect transistor, and further comprising:

epitaxially growing a second source/drain region of the vertical-transport field-effect transistor over the one or more semiconductor fins.

4. The method of claim 3 wherein the second source/drain region, the source region, and the drain region are sections of a semiconductor material concurrently grown by an epitaxial growth process.

5. The method of claim 4 wherein the second gate electrode is arranged in a vertical direction between the first source/drain region and the second source/drain region.

6. The method of claim 2 wherein removing the first sacrificial fin and the second sacrificial fin from the first device region comprises:

masking the one or more semiconductor fins and the second device region with an etch mask; and after masking the one or more semiconductor fins and the second device region with the etch mask, etching the first sacrificial fin and the second sacrificial fin.

7. The method of claim 1 wherein concurrently forming the first gate electrode arranged on the first device region between the first sacrificial fin and the second sacrificial fin and the second gate electrode wrapped about the one or more semiconductor fins comprises:

depositing one or more conductor layers over the first device region and the second device region; and patterning the one or more conductor layers to form the first gate electrode and the second gate electrode.

8. The method of claim 1 wherein the first gate dielectric is comprised of silicon dioxide.

9. The method of claim 1 wherein the second gate electrode is separated from the one or more semiconductor fins by the second layer of the second gate dielectric.

10. The method of claim 1 wherein the second device region includes a source/drain region of the vertical-transport field-effect transistor, and further comprising:

forming a spacer layer on the second device region, wherein the spacer layer and the first gate dielectric are concurrently formed, and the spacer layer is arranged between the source/drain region and the second gate electrode.

\* \* \* \* \*